United States Patent
Liu et al.

(10) Patent No.: US 7,661,319 B2
(45) Date of Patent: Feb. 16, 2010

(54) MICROMACHINED ARTIFICIAL HAIRCELL

(75) Inventors: Chang Liu, Winnetka, IL (US); Jonathan Engel, Minneapolis, MN (US); Nannan Chen, Urbana, IL (US); Jack Chen, Fremont, CA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 11/809,523

(22) Filed: Jun. 1, 2007

(65) Prior Publication Data

US 2008/0072683 A1    Mar. 27, 2008

Related U.S. Application Data

(60) Provisional application No. 60/810,800, filed on Jun. 2, 2006.

(51) Int. Cl.
    *G01B 7/16*      (2006.01)
(52) U.S. Cl. .......................... 73/774; 73/777
(58) Field of Classification Search .................. 73/774, 73/777
See application file for complete search history.

(56) References Cited

U.S. PATENT DOCUMENTS

| | | | |
|---|---|---|---|
| 3,645,275 A | | 2/1972 | Nolen |
| 4,611,171 A | | 9/1986 | Woods |
| 4,875,533 A | * | 10/1989 | Mihara et al. ............... 177/144 |
| 4,951,510 A | * | 8/1990 | Holm-Kennedy et al. .................... 73/862.041 |
| 5,037,515 A | | 8/1991 | Tsai et al. |
| 5,095,762 A | * | 3/1992 | Holm-Kennedy et al. .................... 73/862.041 |
| 5,412,994 A | | 5/1995 | Cook et al. |
| 5,483,834 A | | 1/1996 | Frick |
| 5,726,480 A | | 3/1998 | Pister |
| 5,872,320 A | | 2/1999 | Kamentser et al. |
| 6,151,771 A | | 11/2000 | Tzeng et al. |
| 6,230,563 B1 | * | 5/2001 | Clark et al. .............. 73/504.04 |
| 6,250,141 B1 | | 6/2001 | Geyer |
| 6,259,951 B1 | | 7/2001 | Kuzma et al. |
| 6,304,840 B1 | | 10/2001 | Vance et al. |
| 6,452,499 B1 | | 9/2002 | Runge et al. |
| 6,479,890 B1 | | 11/2002 | Trieu et al. |
| 6,575,020 B1 | * | 6/2003 | de Charmoy Grey et al. ......................... 73/54.23 |
| 6,631,638 B2 | | 10/2003 | James et al. |
| 6,825,539 B2 | | 11/2004 | Tai et al. |
| 6,826,960 B2 | * | 12/2004 | Schaad et al. ............ 73/514.29 |
| 6,923,054 B2 | | 8/2005 | Liu et al. |
| 7,122,152 B2 | | 10/2006 | Lewis et al. |
| 7,135,852 B2 | | 11/2006 | Renken et al. |

(Continued)

FOREIGN PATENT DOCUMENTS

WO    WO-02/095785    11/2002

(Continued)

OTHER PUBLICATIONS

Liu, "Artificial Haircell & Artificial Lateral Line Sensor" presentation, CBID Conference, May 2006.

(Continued)

*Primary Examiner*—Max Noori
(74) *Attorney, Agent, or Firm*—Greer, Burns & Crain, Ltd.

(57) ABSTRACT

A micromachined artificial sensor comprises a support coupled to and movable with respect to a substrate. A polymer, high-aspect ratio cilia-like structure is disposed on and extends out-of-plane from the support. A strain detector is disposed with respect to the support to detect movement of the support.

17 Claims, 11 Drawing Sheets

U.S. PATENT DOCUMENTS

| | | | |
|---|---|---|---|
| 7,137,291 | B2* | 11/2006 | Mancevski .................. 73/105 |
| 7,150,195 | B2 | 12/2006 | Jacobsen |
| 7,357,035 | B2 | 4/2008 | Liu et al. |
| 2002/0049080 | A1 | 4/2002 | Thompson |
| 2004/0142477 | A1 | 7/2004 | Kumagai et al. |
| 2007/0234793 | A1 | 10/2007 | Liu |
| 2008/0022513 | A1 | 1/2008 | Liu |
| 2008/0022778 | A1 | 1/2008 | Liu |
| 2008/0072682 | A1 | 3/2008 | Liu |
| 2008/0089383 | A1 | 4/2008 | Liu |

FOREIGN PATENT DOCUMENTS

| | | |
|---|---|---|
| WO | WO-03/021679 | 3/2003 |

OTHER PUBLICATIONS

J. Chen et al., "Towards Modular Integrated Sensors: The Development of Artificial Haircell Sensors Using Efficient Fabrication Methods," Proceedings of the 2003 IEEE/RSJ Intl. Conference on Intelligent Robots and Systems, Las Vegas, Nevada, Oct. 2003.

J. Chen et al., "An Artificial Lateral Line," Manuscript submitted to Science, Microtechnology Laboratory, University of Illinois Urbana-Champaign.

Ayers, J., Zavracky, P.M., McGruener, N., Massa, D., Vorus, V., Mukherjee, R., Currie, S., 1998, "A Modular Behavioral-Based Architecture for Biomimetic Autonomous Underwater Robots," Proc. Autonomous Vehicles in Mine Countermeasures Symp., Naval Postgraduate School, CD ROM, http://www.cix.plym.ac.uk/cis/InsectRobotics/Biomimetics.htm, pp. 1-18.

Barnes, T.G., Truong, T.Q., Lu, X., McGruer, E., Adams, G.G., "Design, Analysis, Fabrication, And Testing of a MEMS Flow Sensor," 1999 ASME International Congress and Exposition on MEMS, vol. 1, 1999, pp. 355-361.

Beebe, D.J., Hsieh, A.S., Denton, D.D., and Radwin, R.G., "A Silicon force Sensor for Robotics and Medicine," Sensors and Actuators, A 50, 1995, pp. 55-65.

Boillat, M.A., van der Wiel, A.J., Hoogerwerf, A.C., de Rooij, N.F., "A Differential Pressure Liquid Flow Sensor for Flow Regulation and dosing Systems," Proc. IEEE Micro Electro Mechanical Systems, 1995, pp. 350-352.

Chen, J., Zou, J., Liu, C., "A Surface Micromachined, Out-of-Plane Anemometer," Proc of MEMS 02, Las Vegas, NV, 2002, pp. 332-335.

Chen, J., Engel, J., Liu, C., "Development of Polymer-Based Artificial Haircell Using Surface Micromachining and 3D Assembly," 12th Intl. Conf. On Solid-State Sensors, Actuators and Microsystems, Boston, MA, 2003.

Chen, J. & Liu, C. "Development and characterization of surface micromachined, out-of-plane hot-wire anemometer." JMEMS 12, 979-88 (2003).

Chen, J., Fan, Z., Engel, J., Liu, C., "Two Dimensional Micromachined Flow Sensor Array for Fluid Mechanics Studies," ASCE Journal of Aerospace Engineering, Apr. 2003, pp. 85-97.

de Bree, H-H, Jansen, H.V., Lammerink, T.S.J., Krijnen, G.J.M, Elwenspoek, m., 1999, "Bi-Directional Fast Flow Sensor with a Large Dynamic Range," J. Micromech. Microeng. 9 (1999), pp. 186-189.

Ebefors, T., Kalvesten, E., Stemme, G., "Three Dimensional Silicon Triple-Hot-Wire Anemometer Based on Polyimide Joints," Proc. 11th Annual Int. Workshop on Micro Electro Mechanical Systems: An Investigation of Micro Structures, Sensor, Actuators, Machines and Systems, Heidelberg, Germany, 1998, pp. 93-98.

Editor, "Touchy Touchy," The Economist, 2002, pp. 66-67.

Engel, J., Chen, J., Liu, C, "Development of a Multi-Modal, Flexible Tactile Sensing Skin Using Polymer Micromachining," 12th Intl. Conf. On Solid-State Sensors, Actuators and Microsystems, Boston, MA, 2003.

Engel, J., Chen, J., Liu, C, "Development of Polyimide Flexible Tactile Sensor Skin," Journal of Micromechanics and Microengineering, vol. 13, No. 9, 2003, pp. 359-366.

Enoksson, P., Stemme, G., Stemme, E., "A Coriolis Mass Flow Sensor Structure in Silicon," Proc. 9th Annual Int. Workshop on Micro Electro Mechanical Systems: An Investigation of Micro Structures, Sensors, Actuators, Machines and Systems, 1996, pp. 156-161.

Fan, Z., Chen, J., Zou, J., Bullen, D., Liu, C., and Delcomyn, F., "Design and Fabrication of Artificial Lateral Line Flow Sensors," Journal of Micromechanics and Microengineering, 12 (Sep. 2002), pp. 655-661.

Gray, B.L., Fearing, R.S., "A Surface Micromachined Microtactile Sensor Array," Proc 1996 IEEE Int'l Conf. On Robotics and Automation, Minneapolis, MN, 1996, pp. 1-6.

Jiang, F., Tai, Y.C., Ho, C.M., Rainer, K., and Garstenauer, M., "Theoretical and Experimental Studies of Micromachined Hot-Wire Anemometer, Digest IEEE Int. Electron Devices Meetings (IEDM) (San Francisco), 1994, pp. 139-142.

Jiang, F., Tai, Y.C., Walsh, K., Tsao, T., Lee, G.B., Ho, C.M., "A Flexible MEMS Technology and its First Application to Shear Stress Sensor Skin," Proc 1997 IEEE Int'l Conf. On MEMS, pp. 465-470.

Kalvesten E., Vieider C., Lofdahl, L., Stemme, G., "An Integrated Pressure-Flow Sensor for Correlation Measurements in Turbulent Gas Flows," Sensors Actuators A 52, 1996, pp. 51-58.

Kane, B.J., Cutkosky, M.R., Kovacs, T.A., "A Traction Stress Sensor Array for Use in High-Resolution Robotic Tactile Imaging," Journal of MEMS, vol. 9, 2000, pp. 425-434.

Kolesar, E.S., Dyson, C.S., "Object Imaging with a Piezoelectric Robotic Tactile Sensor," Journal of MEMS, vol. 4, No. 2, 1995, pp. 87-96.

Lee, M.H., Nicholls, H.R., "Tactile Sensing for Mechatronics—a State of the Art Survey," Mechatronics, vol. 9, 1999, pp. 1-33.

Leineweber, M., Pelz, G., Schmidt, M., Kappert, H., Zimmer, G., "New Tactile Sensor Chip with Silicone Rubber Cover," Sensors and Actuators vol. 84, 2000, pp. 236-245.

Li, J., Fan, J., Chen, J., Zou, J, Liu, C., Delcomyn, F., "High Yield Microfabrication Process for Biomimetic Artificial Haircell Sensors," smart Electronics, MEMS, and Nanotechnology, Conference (Conference 4700), SPIE's 9th annual International Symposium on Smart Structures and Materials, Mar. 17-21, 2002, San Diego, CA.

Liu et al., "Polymer Micromachining and Applications in Sensors, Microfluidics, and Nanotechnology," 226th American Chemical Society National Meeting, New York, 2002.

Liu, C., Huang, J., Zhu, Z., Jiang, F., Tung, S., Tai, Y.C., Ho, C.M., "A Micromachined Flow Shear-Stress Sensor Based on Thermal Transfer Principles," IEEE/ASME Journal of Microelectromechanical Systems (JMEMS), vol. 8, No. 1, 1999, pp. 90-99.

Lofdahl, L., Kalvesten, E., Hadzianagnostakis, T., Stemme, G., "An Integrated Silicon Based Wall Pressure-Shear Stress Sensor for Measurements in Turbulent Flows," DSC-vol. 59, Proc. 1996 Int. Mechanical Engineering Congress and Exposition, New York, NY, 1996, pp. 245-251.

Lofdahl, L., Stemme, E., Stemme, G., 2001, "Silicon Based Flow Sensors Used for Mean Velocity and Turbulence Measurements," Exp. in Fluids, 12, 1992, pp. 270-276.

Martin, R., "Mother Knows Best: Imitating Nature is the Sincerest Form of Flattery," Forbes ASAP, 2002, pp. 26-29.

Ozaki, Y., Ohyama, T., Yasuda, T., Shimoyama, I., "An Air Flow Sensor Modeled on Wind Receptor Hairs of Insects," Proc. MEMS '00, Miyazaki, Japan, pp. 531-536.

Padmanabhan, A., Goldberg, H., Breuer, K.D., Schmidt, M.A., "A Wafer-Bonded Floating-Element Shear Stress Microsensor with Optical Position Sensing by Photodiodes," J. Microelectromech. Syst., vol. 5, No. 4, 1996, pp. 307-315.

Petersen, "Silicon as a Mechanical Material," Proc of the IEEE, vol. 70, No. 5, 1983, pp. 420-457.

Pfann, W.G., Thurston, R.N., "Semiconducting Stress Transducers Utilizing the Transverse and Shear Piezoresistance Effects," J. Appl., Phys. vol. 32, No. 10, 1961, pp. 2008-2009.

Reston, R.R., Kolesar, E.S., "Robotic Tactile Sensor Array Fabricated from a Piezoelectric Polyvinylidene Fluoride Film," Proc 1990 IEEE NAECON 3, pp. 1139-1144.

Richter, M., Wackerle, M., Woias, P., and Hillerich, B., 1999, "A Novel Flow Sensor with High Time Resolution Based on Differential Pressure Principle," Proc., 12 Int. Conf. On Micro Electro Mechanical Systems (Orlando, FL), pp. 118-123.

Shida, K., Yuji, J.I., "Discrimination of Material Property by Pressure-Conductive Rubber Sheet Sensor with Multi-Sensing Function," Proc 1996 IEEE Int'l Symp. On Industrial Electronics, vol. 1, pp. 54-59.

Shimizu, T., Shikida, M., Sato, K., Itoigawa, K., "A New Type of Tactile Sensor Detecting Contact Force and Hardness of an Object," Proc 2002 IEEE Int'l Conf. On MEMS, 2002, pp. 344-347.

Su et al., "Characterization of a Highly Sensitive Ultra-Thin Piezoresistive Silicon, Cantilever Probe and its Application in Gas Flow Velocity Sensing," Journal of Micromechanics and Microengineering, vol. 12, 2002, pp. 780-785.

Sugiyama, S., Kawahata, K., Yneda, M., Igarashi, I, "Tactile Image Detection Using a 1K-Element Silicon Pressure Sensor Array," Sensors and Actuators A21-A23, 1990, pp. 397-400.

Svedin, N., Kalvesten, E., Stemme, E., Stemme, G., "A New Silicon Gas-flow Sensor Based on Lift Force," J. Microelectromech. Syst., vol. 7, No. 3, 1998, pp. 303-308.

Svedin, N., Stemme, E., Stemme G., "A Static Turbine Flow Meter with a Micromachined Silicon Torque Sensor," Technical Digest MEMS 2001: 14$^{th}$ IEEE Int. Conf. On Micro Electro Mechanical Systems (Interlaken, Switzerland), 2001, pp. 208-211.

Thaysen et al., "Polymer-based Stress Sensor with Integrated Readout," Journal of Physics D—Applied Physics, vol. 35, No. 21, Nov. 2002, pp. 2698-2703.

van Baar, J.J., Wiegerink, R.J., Iammerink, T.S.J., Krijnen, G.J.M., Elwenspoek, M., "Micromachined Structures for Thermal Measurements of Fluid and Flow Parameters," J. Micromech. Micoeng., 11, 2001, pp. 311-318.

van der Wiel, A.J., Linder, C., Rooij de, N.F., Bezinge, A., 1993, "A Liquid Velocity Sensor Based on the Hot-Wire Principle," Sensors Actuators, A37-A38, pp. 693-697.

van Honschoten, J.W., Krijnen, G.J.M., Svetovoy, V.B., de Bree, H-E, Elwenspoek, M.C., 2001, "Optimization of a Two Wire Thermal Sensor for Flow and Sound Measurements," Proc. 14$^{th}$ Int. Conf. Micro Electro Mechanical Systems (MEMS'2001), pp. 523-526.

Xu, Y., Jiang, F., Lin, Q., Clendenen, J., Tung, S., and Tai, Y.C., 2002, "Under Water Shear Stress Sensor," MEMS '02: 15$^{th}$ IEEE Int. Conf. On Micro Electro Mechanical Systems, Las Vegas, NV, 2002, pp. 340-343.

Zou, Jun Chen, L., Liu, C., Schutte-aine, J., "Plastic Deformation Magnetic Assembly (PDMA) of Out-of-Plane Microstructures: Technology and Application," Journal of Microelectromechanical Systems, vol. 10, No. 2, 2001, pp. 302-309.

* cited by examiner

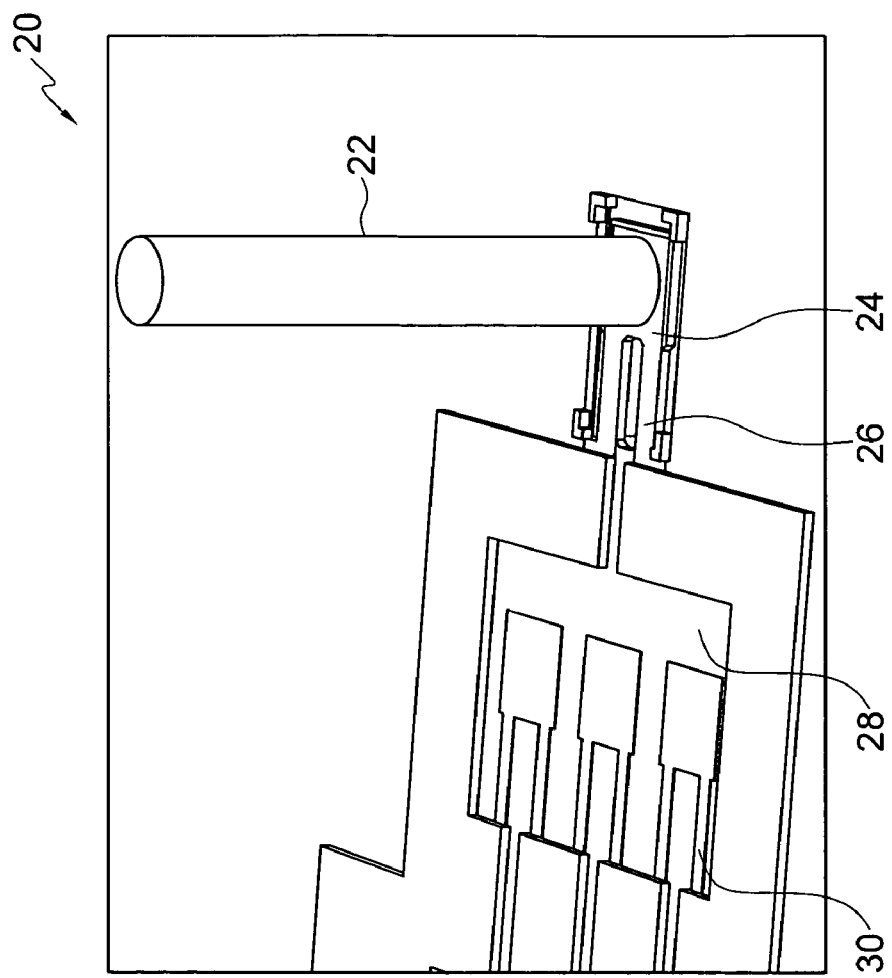
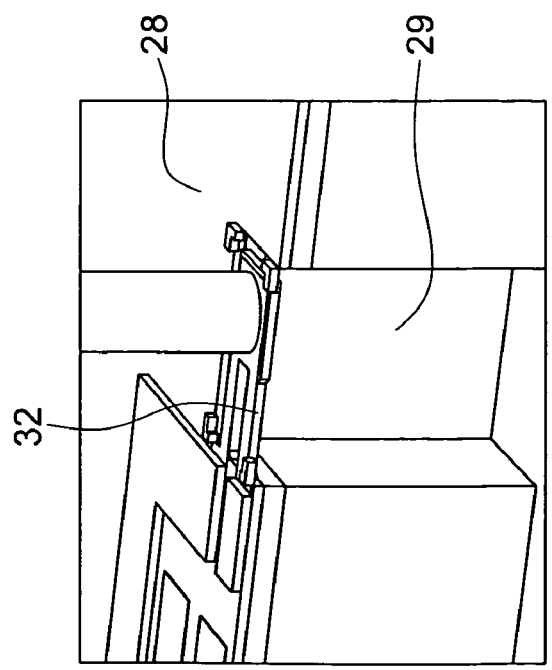

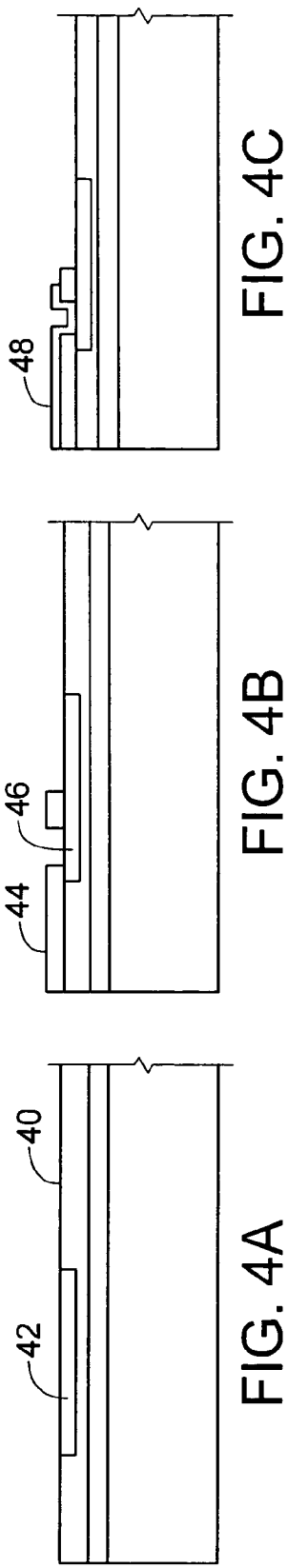
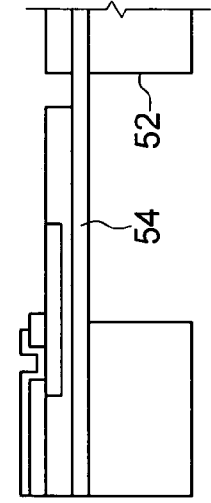
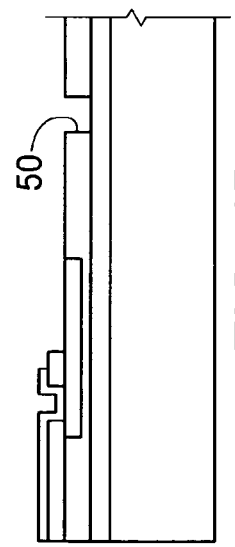
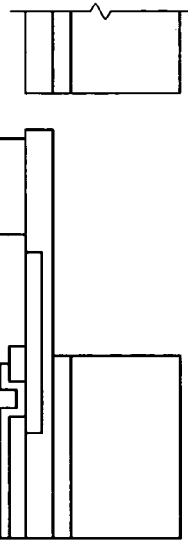
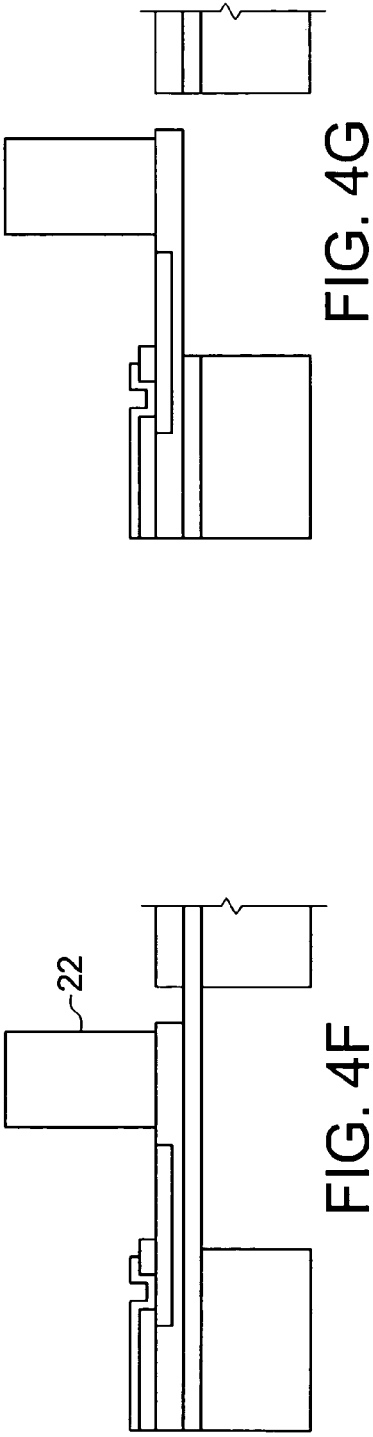

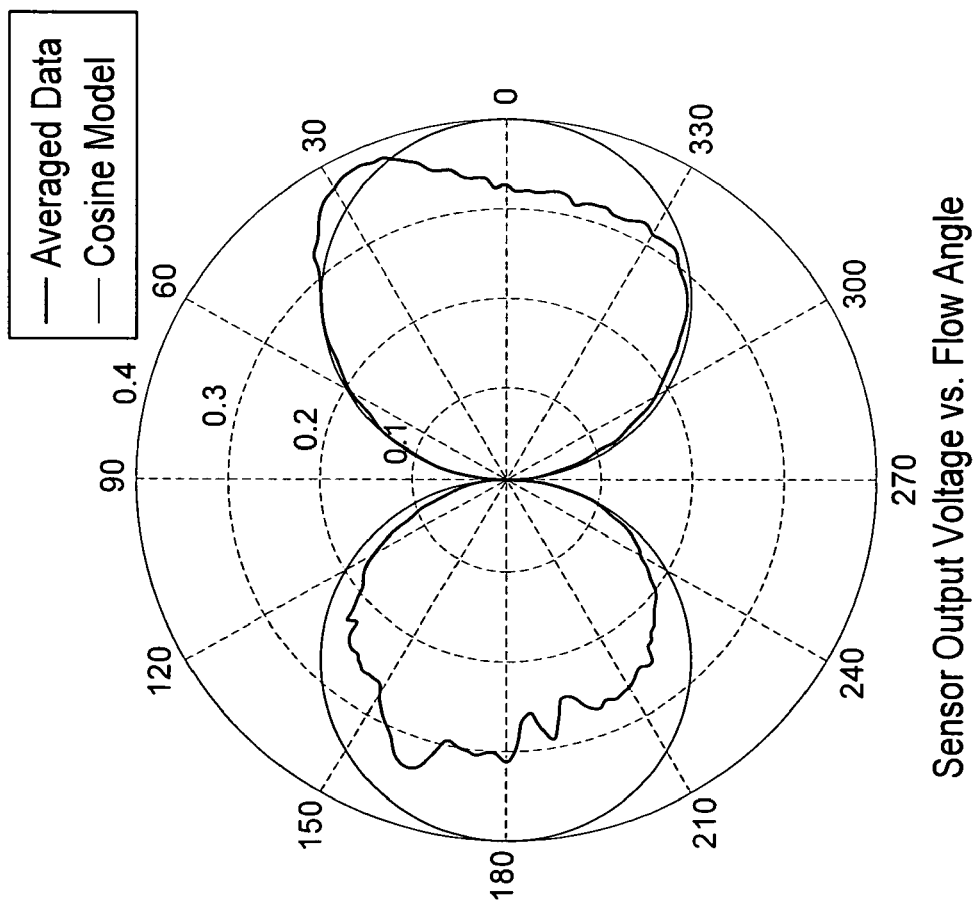
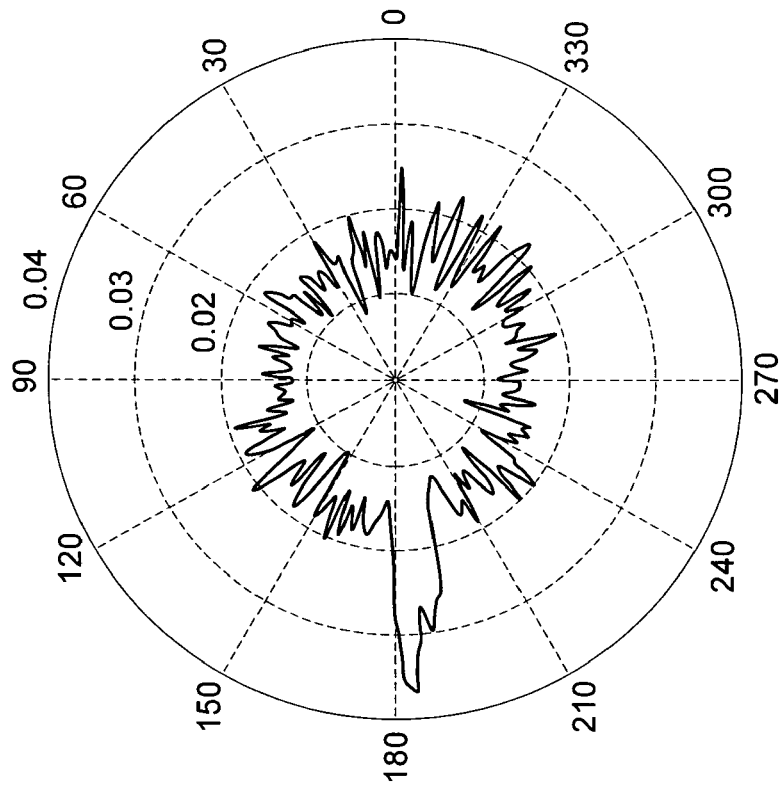
FIG. 7B
Standard Deviation of Sensor Output vs. Flow Angle
FIG. 7A
Sensor Output Voltage vs. Flow Angle

US 7,661,319 B2

MICROMACHINED ARTIFICIAL HAIRCELL

PRIORITY CLAIM

This application claims the benefit of U.S. Provisional Application Ser. No. 60/810,800, filed Jun. 2, 2006, under 35 U.S.C. §119.

STATEMENT OF GOVERNMENT INTEREST

This invention was made with Government assistance under USAF/AFOSR Contract No. F49620-02-2-0496, NASA Contract No. NAG5-8781 and NSF Contract No. IIS0080639, IIS99-84954. The Government has certain rights in this invention.

FIELD OF THE INVENTION

This invention relates generally to the field of microscale devices. The invention also relates generally to the field of artificial sensors.

BACKGROUND OF THE INVENTION

Humans and other animals are able to perceive and process environmental conditions using various sensory attributes. For example, animal skin and hair provide tactile and flow sensing for perception in land and/or water environments. Synthetic (engineered) sensors, on the other hand, typically are constructed on many different physical principles, such as heat and resistance, in an attempt to obtain similar information. Animal sensory systems have attributes that are more elegant and efficient than known engineered sensors.

Engineered sensors, such as micromachined sensors, have been previously developed based on a number of sensing methods. Microfabrication offers benefits including high spatial resolution, fast time response, integrated signal processing, and potentially low costs. Examples of microfabricated sensors include thermal (hot-wire) anemometers and artificial haircells.

In numerous species, including humans, the biological haircell sensor serves as the building block for sensing systems with amazing capabilities. A typical haircell in animals provides a biological mechanoreceptor. FIG. 1 shows a demonstration of a spider receptor haircell sensor 10. The haircell 10 includes a cilium 12 attached to tissue 14 via a cuticular membrane 16. The cilium 12 is connected to a neuron 18. Bending the cilium 12, as shown in the right side of FIG. 1, affects a signal path, producing a changed signal. This change is used for reception.

The functions of animal haircells have been very closely studied by biologists over the years. However, in recent years, with the development of micromachining techniques, researchers have started to mimic the stimulus-transmission mechanism of biological sensing systems.

Artificial haircells have been produced by the present inventors and by others. One example artificial haircell provided by one or more of the present inventors is described in J. Chen, Z. Fan, J. Engel, and C. Liu, "Towards Modular Integrated Sensors: The Development of Artificial Haircell Sensors Using Efficient Fabrication Methods", Proceedings of the 2003 IEEE/RSJ Intl. Conference on Intelligent Robots and Systems, Las Vegas, Nev., October 2003. This haircell is typically formed from bulk micromachining. It includes a silicon-based, in-plane fixed-free cantilever on a silicon substrate. A vertical silicon cilium is provided at a distal free end. A force or a flow, such as an external flow parallel to the substrate, impacts upon the vertical cilium. Due to a rigid connection between the in-plane cantilever and the vertical cilium, a mechanical bending element is transferred to the cantilever beam, inducing strain at the base of the cantilever beam. This strain is detected using a strain sensor.

In another example artificial haircell provided by one or more of the present inventors and also described in J. Chen et al., a cilium is anchored by one or more rigid metal supports. The cilium preferably is made of a surface micromachined polymer and includes a stiff permalloy plating. A strain gauge is attached at the base of the cilium and includes a resistor, such as a nichrome resistor, on a polyimide backing. When an external force is applied to the cilium, the cilium deflects, causing the strain gauge to stretch or compress. The resulting change in resistance is detected.

Yet another artificial haircell provided by the one or more of the present inventors, as disclosed in J. Engel, J. Chen, D. Bullen, and C. Liu, "Polyurethane Rubber as a MEMS Material: Characterization and Demonstration of an All-Polymer Two-Axis Artificial Haircell Flow Sensor," 18$^{th}$ IEEE International Conference on Micro Electro Mechanical Systems, MEMS 2005, Miami Beach, Fla. USA, January 2005, includes a sensor made entirely of polymer materials from a substrate level up. Polyurethane elastomers are utilized for sensing and structures. Such a haircell can detect two-axis deflection of a vertical polyurethane cilium using, for example, a plurality of carbon-impregnated polyurethane force sensitive resistors disposed at a base of the cilium.

SUMMARY OF THE INVENTION

According to example embodiments of the present invention, a micromachined artificial sensor comprises a support coupled to and movable with respect to a substrate. A polymer, high-aspect ratio cilia-like structure is disposed on and extends out-of-plane from the support. A strain detector is disposed with respect to the support to detect movement of the support.

BRIEF DESCRIPTION OF THE DRAWINGS

FIG. 2 is a perspective view and cross-sectional view of an artificial haircell according to an embodiment of the present invention;

FIGS. 4A-4G show steps in an example fabrication process for an artificial haircell, according to an embodiment of the present invention;

FIGS. 7A-7B show sensor output voltage vs. flow angle and standard deviation of sensor output vs. flow angle for an example artificial haircell;

DETAILED DESCRIPTION

Figure 1:
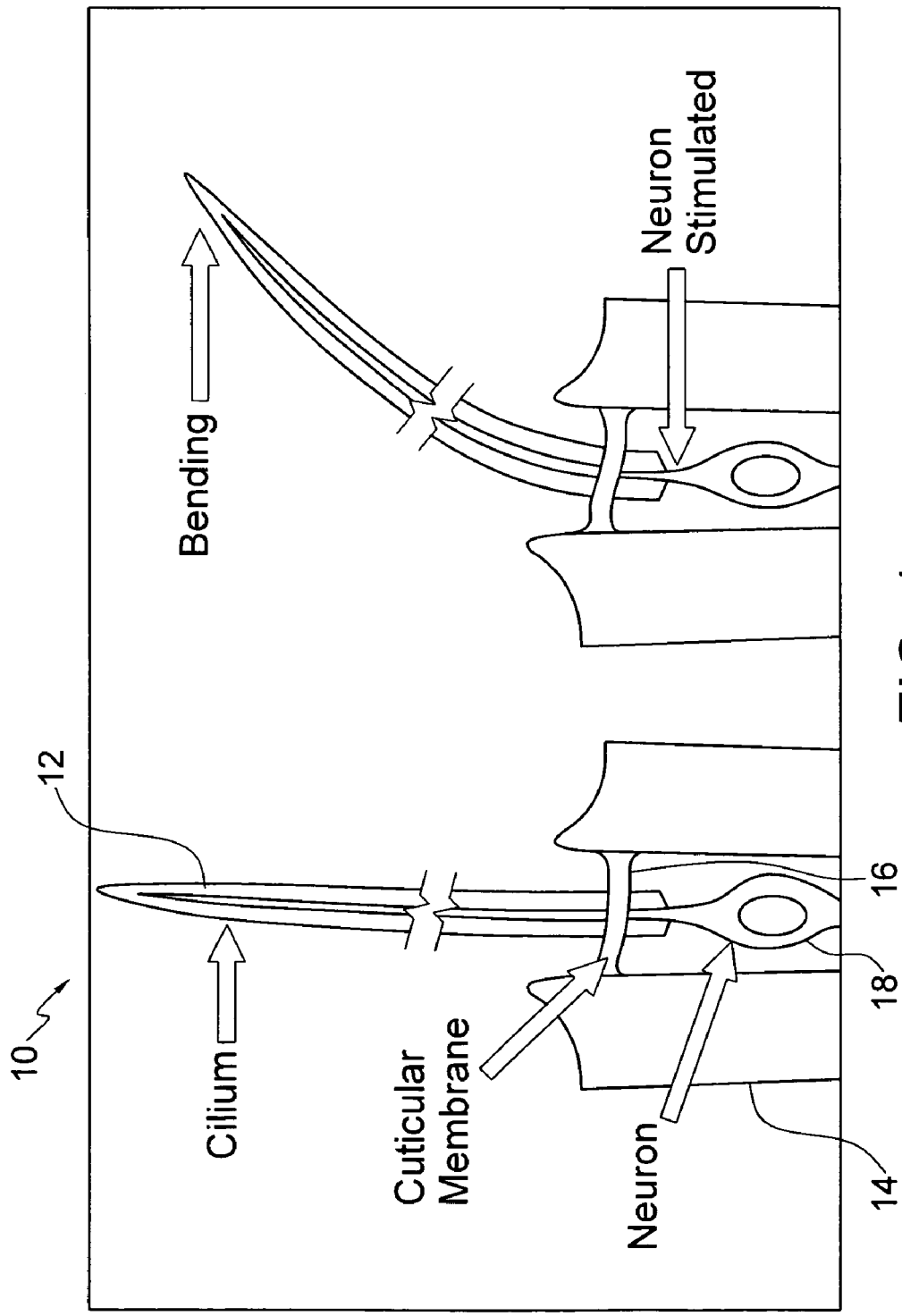
FIG. 1 is a schematic view of a typical spider receptor hair cell sensor.

Sensing capacities have been captured through micromachined artificial haircells. However, it is desirable to improve robustness, flexibility, and/or sensitivity for artificial sensors in various real-world sensing environments.

Embodiments of the present invention provide artificial sensors that can mimic one or more animal sensors. Such artificial sensors can be designed or modified for use in any of various sensor functions. Preferably, such artificial sensors exhibit a desired degree of robustness, flexibility, and sensitivity. Particular artificial sensors according to embodiments of the present invention can be designed and produced at relatively low cost, and on a large scale if needed, while allowing the flexibility and adaptability to substitute for various types of sensors found in nature.

Generally, a micromachined artificial haircell according to an example embodiment of the present invention includes a high-aspect ratio (e.g., greater than 1:1) and tall (e.g., at or above 20 microns) cilia-like structure, i.e., a cilia-like artificial hair, attached to a movable support. The hair is positioned generally out-of-plane of the support so that it can receive a force from any of a variety of sources and displace in response to the force. Preferably, the hair is made from a polymer material. Displacement of the hair couples the force to the movable support, and in turn causes movement in the support. A strain detector is provided on the support to sense displacement of the support. Preferably, the strain detector includes one or more piezoresistors formed by doping all of part of the support.

The support may be, as nonlimiting examples, a cantilevered support, a beam, a membrane, and/or a paddle on which the hair is disposed. The support may be formed, as a nonlimiting example, from silicon by micromachining. The configuration, flexibility, etc. of the support can vary depending on the range of inputs expected (i.e., the operational envelope). An example support includes a silicon paddle, which preferably but not necessarily is a cantilever or beam. In an example embodiment, the paddle is a single support (fixed-free) cantilever beam. Under this configuration, the force coupled through the hair to the beam is introduced as a moment load on the beam. The provided strain gauge measures displacement (strain) at the end of the silicon paddle (cantilever beam or mechanical beam). However, the support may instead be a fixed-fixed cantilever, a membrane, or other configuration. In an exemplary embodiment, the paddle is supported by beams with doped silicon strain gauges at a base.

The hair, as nonlimiting examples, may be co-fabricated with the support, glued, or otherwise mechanically or chemically attached (e.g., adhered) to the support. The hair extends out of the plane of the support, preferably in a direction generally orthogonal to a plane of the support.

The hair can be made of any of a variety of materials, if the material(s) used can build the hair in a high-aspect ratio. Nonlimiting examples for hair materials include polymers, such as photodefinable polymer, elastomer, rubber, etc. In an example embodiment, the hair has a high-aspect ratio and is made from SU-8 epoxy, formed by spinning and photolithography. Hairs made from SU-8 epoxy have been demonstrated by the present inventors to have a minimal displacement resolution. Haircells including SU-8 epoxy hairs have been applied to underwater flow sensing, and have demonstrated good flow rate sensitivity. The hair may be any of various dimensions, configurations, locations, etc., but a preferred hair should be disposed in a direction generally away from the support and provide via movement a mechanical coupling of a force to the strain detector.

The hair can receive a force via any of a variety of inputs. For example, in addition to a simple vertical hair receiving a flow or direct force input, the hair may be configured, such as but not limited to by co-fabrication or addition of one or more auxiliary parts, to allow other inputs to provide a force to couple to the sensor. Configuration may include, for example, adding or incorporating one or more auxiliary parts suitably coupled to the hair (e.g., formed in or on the hair) to transduce pressure into deformation of the auxiliary part and thus move the hair. Auxiliary parts may include, but are not limited to, transducers for magnetic force, vibration, acceleration (including gravitational), chemical or biochemical absorption force, acoustic force, etc. A nonlimiting example of an auxiliary part is a membrane formed on or coupled to the hair. Thus, for a particular haircell according to features of the present invention, transduction can be one-step (interaction with the hair itself) and/or two or more steps (e.g., interaction of a membrane coupled to the hair to transduce pressure into deformation of the membrane).

An exemplary strain detector includes one or more strain gauges, such as piezoresistive or piezoelectric sensors, which provide one or more signals used to measure strain based on displacement of the hair. The strain gauge, such as a piezoresistive or piezoelectric sensor or sensors, preferably is incorporated into the support (e.g., membrane, beam, or cantilever). This may be done, for example, by doping the support or part of the support. Alternatively, a piezoelectric or piezoresistive sensor or sensors can be deposited on the structure (such as by metal, screen printing, etc.). The purpose of the strain detector is to convert strain in the support structure into an electrical change via resistance change and/or voltage output (e.g., due to a bridge configuration). In an example embodiment, the support is made from a silicon-on-insulator (SOI) wafer to create high sensitivity piezoresistance. For example, the hair may be disposed on a paddle supported by beams, so that the paddle and beams provide the support, and the strain detector may be a piezoresistive sensor disposed on the beams or formed within the beams.

In an example operation, a force due to an input causes displacement of the hair, in turn causing the support that is supporting the hair to be strained. This strain is detected by the strain detector. The input may vary depending on the configuration or environment of the hair, as described above.

Figure 3:
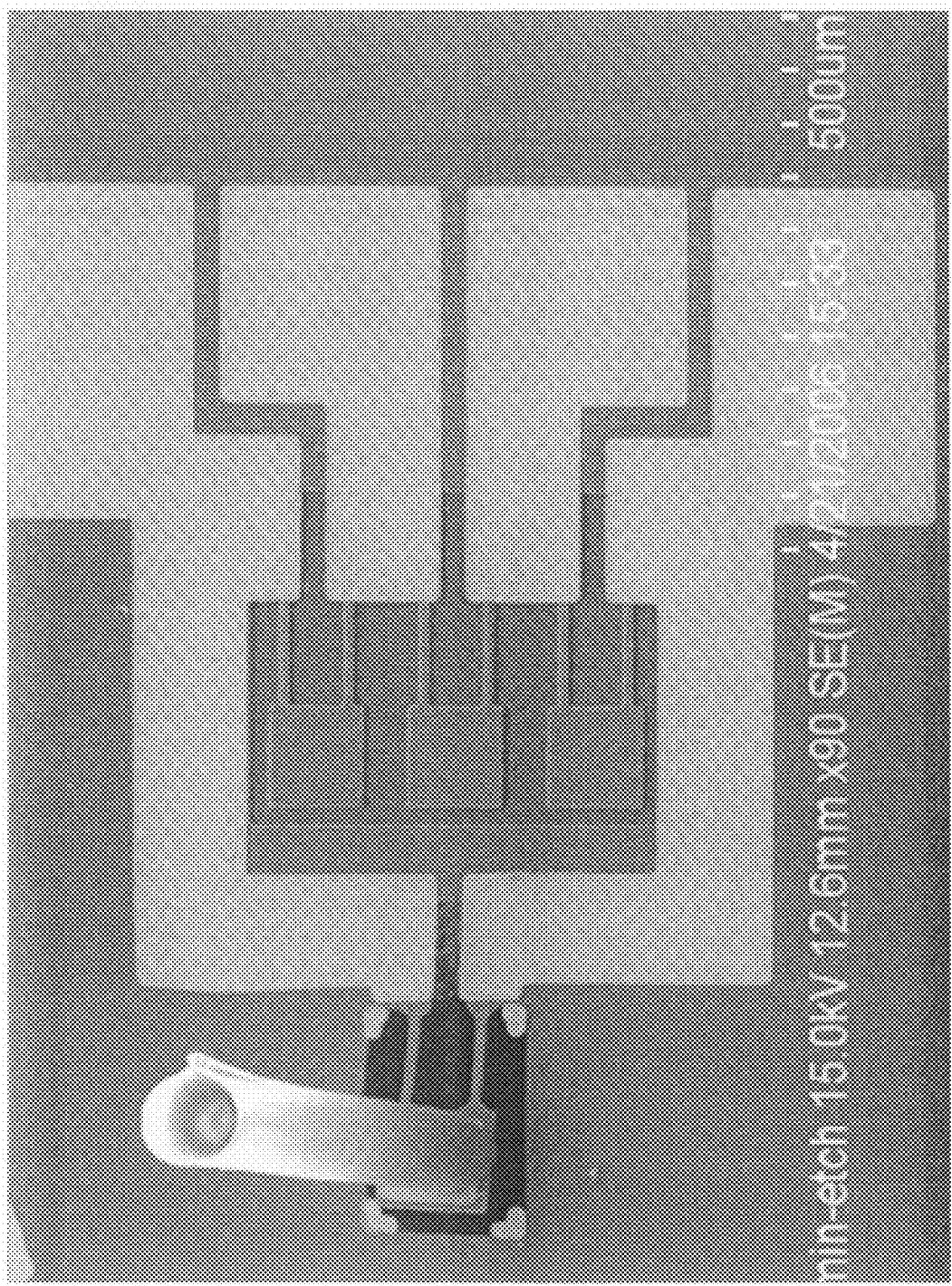
FIG. 3 is a scanning electron microscope (SEM) view of a released artificial haircell according to an embodiment of the present invention.

Turning now to the drawings, FIGS. 2-3 show a cilia-based artificial haircell 20 according to an example embodiment of the invention. Generally, the example haircell 20 is a cilia-based silicon piezoresistive sensing device. The haircell 20 includes a cilia-like hair 22 disposed on a silicon paddle 24 supported by a set of silicon beams 26. Together, the paddle 24 and the beams 26 provide a support for the hair 22. The paddle 24 and beam structure 26 is cantilevered from a preferably silicon substrate 28, which may be, for example, a chip or portion of a chip. Nonlimiting example cantilever dimensions (e.g., the dimensions of the beam structure 26) include a length of 100 μm (e.g., from the attachment point of the bulk silicon substrate 28 to the beginning of the paddle 24), a width of 20 μm (e.g., the sum of the widths of the two beams shown, without the interposed gap), and a thickness of 2 μm. A cavity 29 is provided in the substrate 28 and below the paddle 24 to permit movement of the paddle and the beams 26 in response to displacement of the hair 22.

The substrate 28 may include one or more electrical connections and components, such as but not limited to a series of on-chip resistors 30 forming a Wheatstone bridge. The beams 26 are doped to form strain detectors in the form of strain gauges 32 at a base, and these strain gauges are electrically connected to the resistors 30. The strain gauges may be provided by doping a connection point or connection area between the beams 26 and the substrate 28, or the entire support may be doped. Wiring for connecting the strain gauges 32 to the resistors 30 may be, as nonlimiting examples, gold, gold-titanium, aluminum, etc. For certain contacts, annealing may be performed to provide the contact. Annealing methods will be understood by those of ordinary skill in the art.

The example hair 22 is made of a high aspect ratio SU-8 structure with 80 μm diameter and 500-750 μm height. Another exemplary, non-limiting height range for the hair 22 is 600-800 μm. An exemplary formation process for the hair 22 includes a single spin of SU-8 2075 and photolithography using a Karl Suss aligner.

An example process flow for fabricating the haircell 20 is shown in FIGS. 4A-4G. This example process is robust and takes advantage of high etching selectivity associated with the deep reactive ion etching (DRIE) process. In the example fabrication process, a substrate, such as a silicon-on-insulator (SOI) wafer 40, is subjected to (e.g., doped by) ion implantation (FIG. 4A) to define piezoresistors 42 forming the strain gauges 32 and the Wheatstone bridge resistors 30. In this example fabrication process, all of the resistors 30 for the Wheatstone bridge are fabricated on-chip to minimize the thermal effect of a flow sensor.

Next, as shown in FIG. 4B, an oxide insulator 44 is deposited on the substrate 40 and patterned to provide contact windows 46 to the piezoresistors 42. Metal contact pads 48 are deposited and patterned to define the electrical connections (FIG. 4C). For example, a gold lift-off may be used, though other wiring, such as aluminum wiring, is also contemplated. To define the beams and paddles, a front-side Si etch 50 is performed (FIG. 4D). A DRIE backside etch follows (FIG. 4E), forming backside cavities 52 all the way to an oxide 54.

Figure 5A:
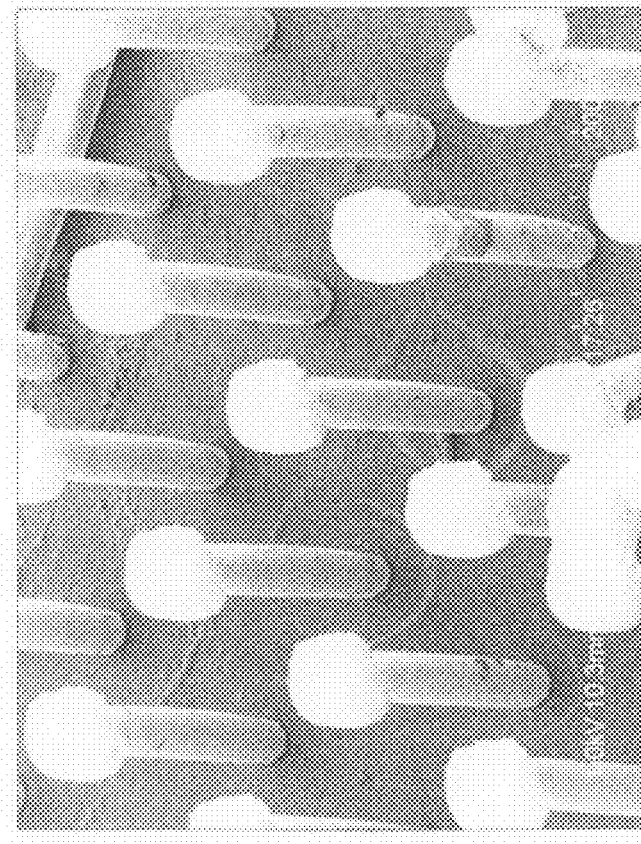
FIGS. 5A-5B are SEM views of SU-8 hairs obtained with optical filtering (showing a "T-topping effect") and without optical filtering, respectively.
Figure 5B:
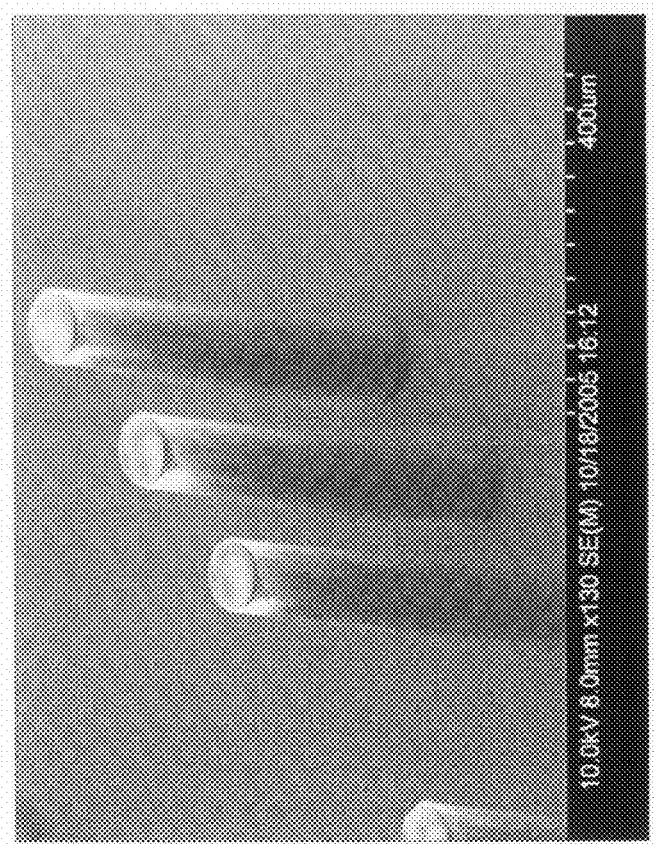

The cilia-like hair 22 is then formed, for example, defined using a SU-8 process (FIG. 4F). The SU-8 process reduces manual handling of the devices and allows batch fabrication of haircell devices. Preferably, a high-pass optical filter is used during exposure to minimize or eliminate the "T-topping" effect of the SU-8 structures. Examples of SU-8 structures with and without the "T-topping" effect, respectively, are shown in FIGS. 5A-5B. Finally, a BHF etch removes the oxide barrier 54 and releases the beam structure (FIG. 4G).

For device characterization of the example haircell 20, a tip-deflection test, resonant frequency test, sensitivity threshold test, and preliminary dipole experiments were performed. The example haircell 22 allows low-frequency (<1 KHz) underwater flow sensing with the capability of detecting very low flow velocity.

Figure 6:
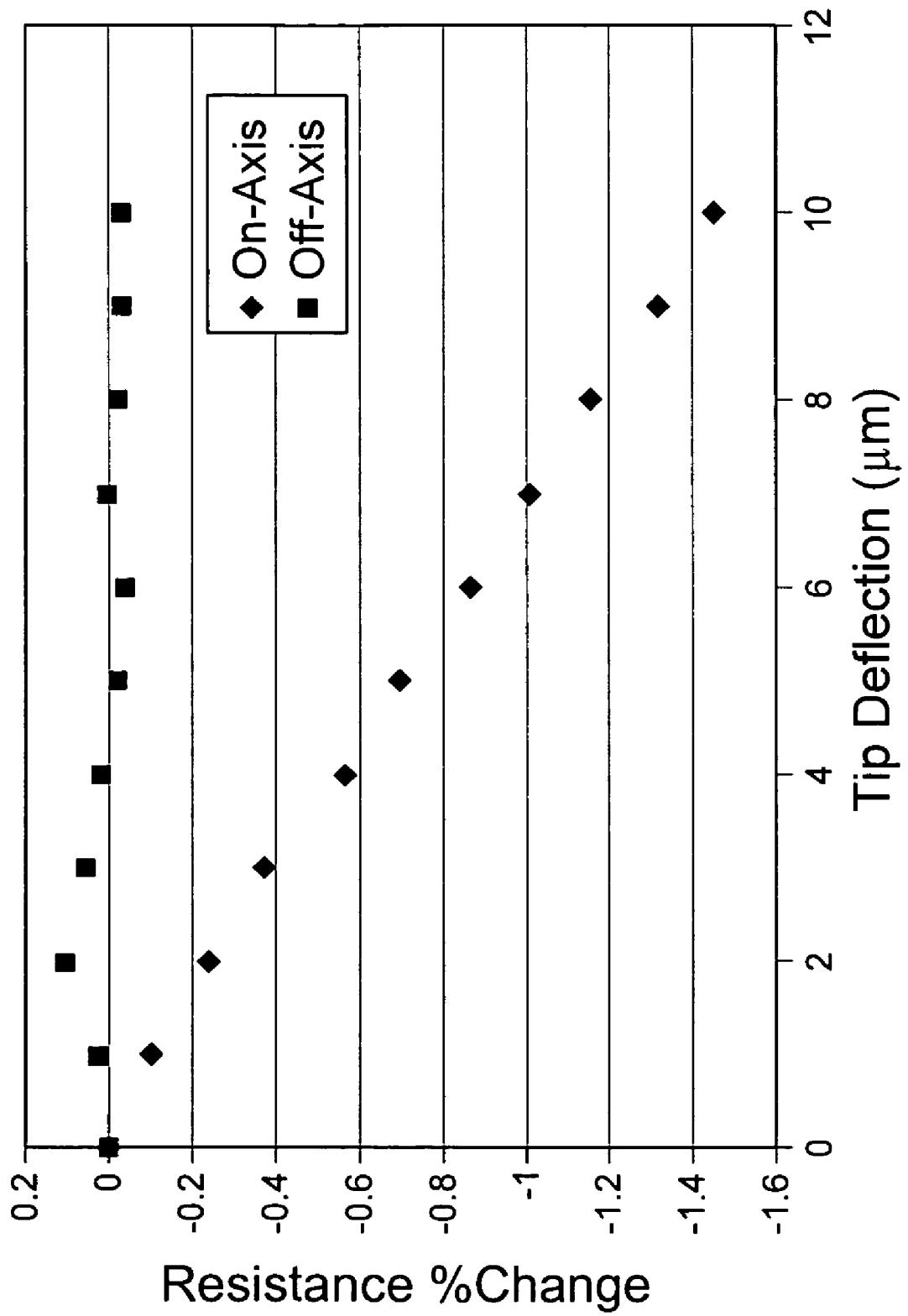
FIG. 6 shows results of a tip deflection test for an example artificial haircell, indicating resistance change due to on-axis and off-axis deflection.

For example, as shown in FIG. 6, the tip-deflection test shows very directional response with 0.1% resistance change due to on-axis deflection (e.g., down the length (longitudinal axis) of the beams 26), and almost no response due to off-axis deflection (e.g., across the length of the beams). Based on the deflection test, the gauge factor of the silicon strain gauge is determined to be 40. FIGS. 7A-7B show another set of tests run for sensor directionality performance. FIG. 7A shows sensor output voltage vs. flow angle, and FIG. 7B shows a standard deviation of sensor output vs. flow angle. An angular resolution of 2.16° with a standard deviation of 0.0151 was determined.

Figure 8:
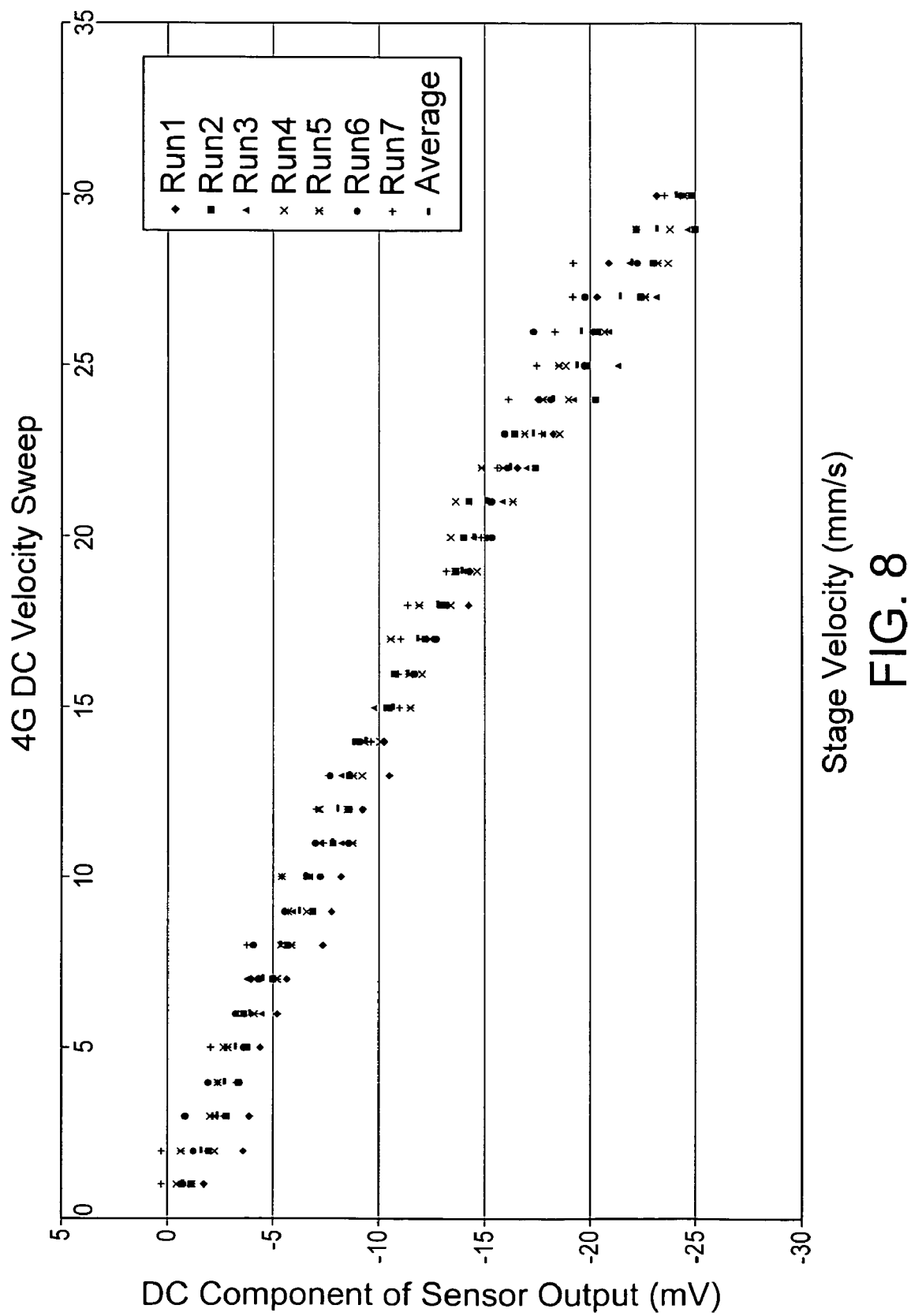
FIG. 8 compares sensor output to stage velocity for a series of velocity sweep runs.

The velocity detection threshold is tested by the underwater dipole experiment. Example results are shown in FIG. 8. By sweeping the dipole vibration frequency and translating it into flow velocity, it was observed that the example haircell sensor can detect flow velocity down to 2 mm/s. This low-velocity detection capability is very significant in real-world testing.

Figure 9:
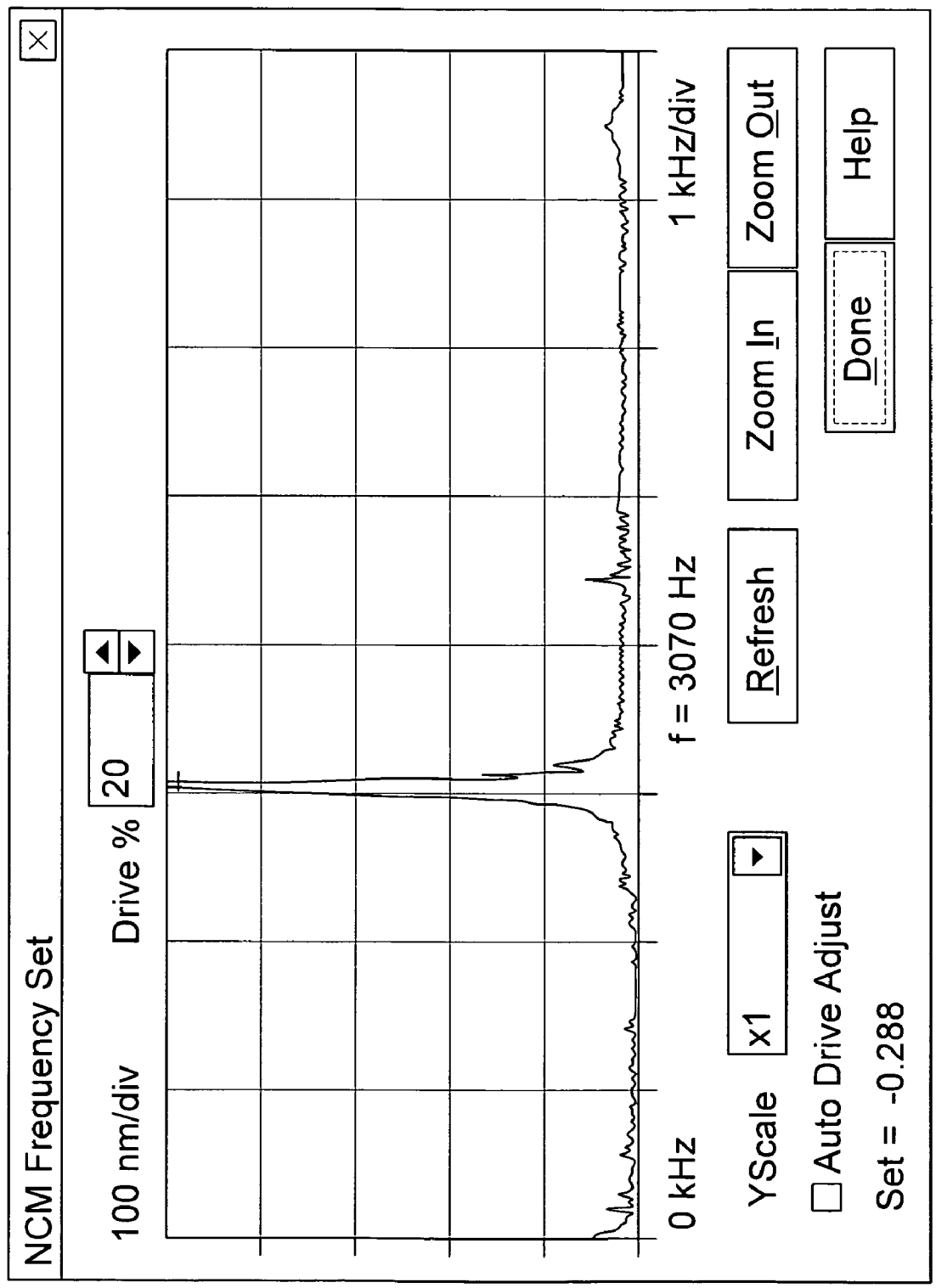
FIG. 9 shows an atomic force microscope (AFM) output of a resonant frequency test, where the AFM operates in non-contact mode.
Figure 10:
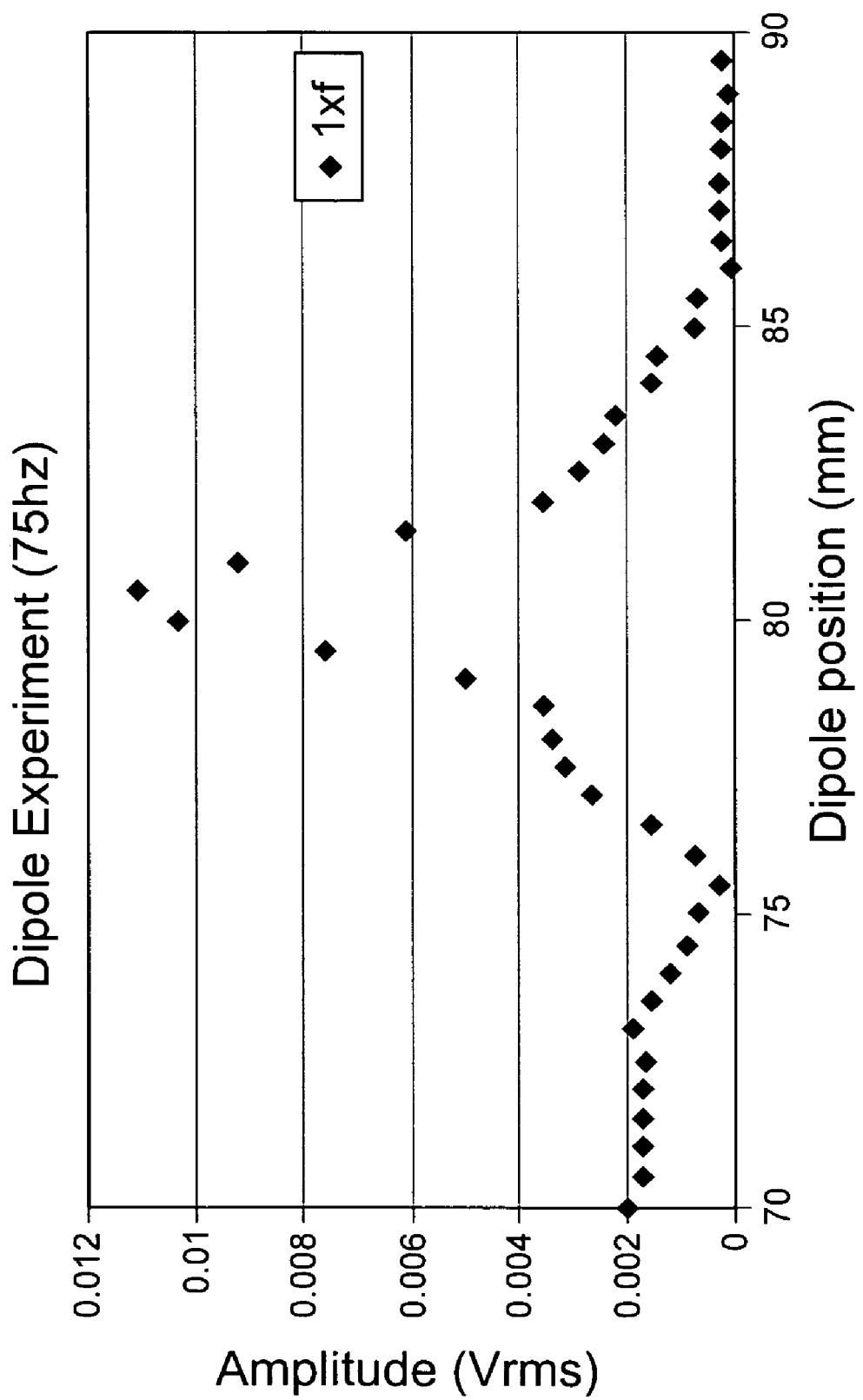
FIG. 10 compares dipole position to amplitude for an example dipole experiment.

The resonant frequency of different geometries has been tested using atomic force microscopy (AFM) under non-contact mode. The resonant frequencies are on the order of a couple of KHz, which satisfies a design specification of low frequency detection. FIG. 9 shows an AFM output of an example resonant frequency test. Preliminary dipole experiments were also performed, and a result showing a peak of response at the position of the example haircell sensor is shown in FIG. 10.

Figure 11:
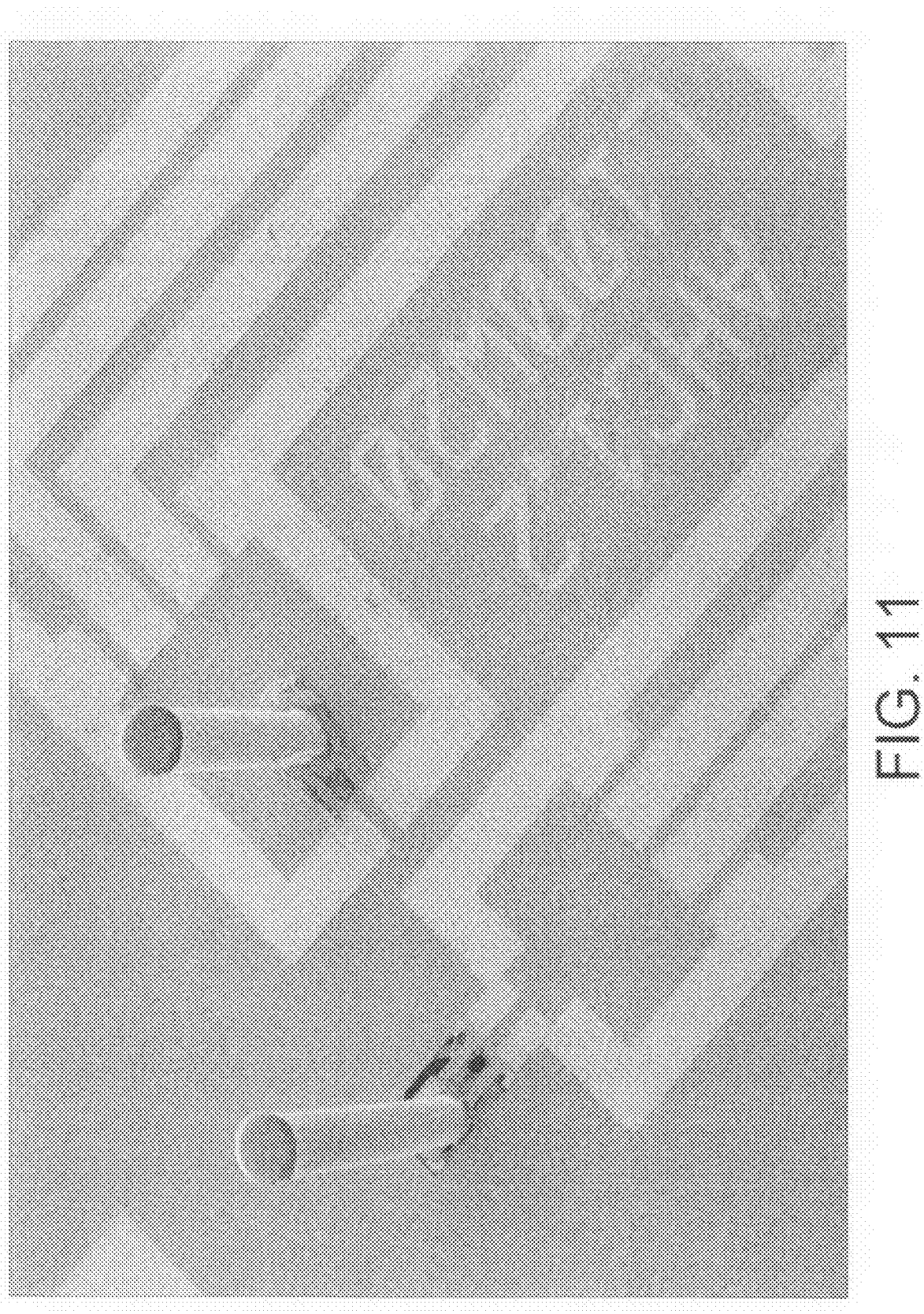
FIG. 11 is an SEM view of a pair of artificial haircells oriented orthogonally.

Arrays of haircells 20 may be formed on one or more substrates 28. Multiple haircell sensors may be oriented, for example, orthogonally, to do precise flow angle detection with precision as high as 1 degree. For example, the longitudinal axis of the supports for the respective haircells may be disposed orthogonally to one another to provide sensitivity along the respective axes. An example of arrayed haircell sensors is shown in FIG. 11. One or more arrays of sensors may be provided for hydrodynamic flow imaging and object tracking for military use and study of nature. Various materials and packaging methods may be used to improve the robustness of the haircell device.

Within haircell sensor arrays, the individual haircells may be configured as desired to sense different inputs, and even vary among the haircells on a single substrate 28. For example, the length of the hair can change, and frequency response, orientation, dynamic range, etc. can be varied as needed. Thus, due to the design of the hair (mechanical features) and/or the accessory coupling mechanism (e.g., coating, etc.), various types of sensing can occur, even on a single substrate if desired.

Haircells according to example embodiments provide a simple receptor that may serve as a modular building block for a variety of sensors, thus providing multi-modal sensing, including applications beyond flow sensing and simple mechanical sensing, if desired. Such various types of sensors may be provided, for example, by varying one or more features of the preferred haircell. For example, haircells according to example embodiments may be used as an acoustic sensor, vibration sensor (1-3 axes), equilibrium sensor, magnetic sensor, airflow sensor (1-3 axes), waterflow sensor (1-3 axes), tactile sensor, accelerometer (e.g., via direct vibration), chemical, biological, or biochemical sensor, and other types of sensors. Cilia operating, for example, as ear hairs may be used to provide a microphone-like device.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the invention are set forth in the appended claims.

What is claimed is:

1. A micromachined artificial sensor comprising:
   a support coupled to and movable with respect to a substrate;

a polymer, high-aspect ratio cilia-like structure disposed on and extending out-of-plane from said support;
a strain detector disposed with respect to said support to detect movement of said support;
wherein said support comprises silicon; and
wherein said support is formed by micromachining the substrate to provide a cavity disposed under said support.

2. The artificial sensor of claim 1, wherein said support comprises at least one cantilevered beam.

3. A micromachined artificial sensor comprising:
a support coupled to and movable with respect to a substrate;
a polymer, high-aspect ratio cilia-like structure disposed on and extending out-of-plane from said support;
a strain detector disposed with respect to said support to detect movement of said support;
wherein said support comprises a paddle supported by at least two cantilevered beams, and wherein said cilia-like structure is disposed on said paddle.

4. The artificial sensor of claim 1, wherein said strain detector comprises a piezoresistive strain gauge formed by doping a portion of said support.

5. The artificial sensor of claim 4, wherein the strain gauge is disposed at or near a connection between said support and the substrate.

6. The artificial sensor of claim 1, wherein said cilia-like structure comprises a generally cylindrical structure having an aspect ratio of greater than 1:1 height:diameter.

7. The artificial sensor of claim 1, wherein said cilia-like structure comprises an epoxy.

8. The artificial sensor of claim 1, wherein said cilia-like structure comprises SU-8 epoxy spun onto said support.

9. The artificial sensor of claim 1, further comprising:
a transducer disposed on said cilia-like structure that deforms or moves in response to a stimulus to move said cilia-like structure.

10. The artificial sensor of claim 9, wherein said transducer comprises at least one of a magnetic transducer, a vibration transducer, an acoustic transducer, a chemical transducer, a biological transducer, and a biochemical transducer.

11. A micromachined sensing apparatus comprising:
a silicon substrate;
a silicon support coupled to and movable with respect to said substrate, wherein a cavity is defined beneath said support;
a polymer, high-aspect ratio cilia-like structure disposed on and extending out-of-plane from said support;
a strain detector disposed with respect to said support to detect movement of said support.

12. The sensing apparatus of claim 11, wherein said support is formed by micromachining said silicon substrate, and wherein said strain detector is formed by doping a portion of said silicon support to provide a piezoresistive strain gauge.

13. The sensing apparatus of claim 11, wherein said cilia-like structure comprises a generally cylindrical structure having an aspect ratio of greater than 1:1 height:diameter.

14. The sensing apparatus of claim 11, further comprising:
a transducer disposed on said cilia-like structure that deforms or moves in response to a stimulus to move said cilia-like structure.

15. A micromachined sensing apparatus comprising:
a silicon substrate;
a silicon support coupled to and movable with respect to said substrate, wherein a cavity is defined beneath said support;
a polymer, high-aspect ratio cilia-like structure disposed on and extending out-of-plane from said support;
a strain detector disposed with respect to said support to detect movement of said support;
further comprising:
an additional silicon support coupled to and movable with respect to said substrate, wherein a cavity is defined beneath said additional support;
an additional polymer, high-aspect ratio cilia-like structure disposed on and extending out-of-plane from said additional support;
an additional strain detector disposed with respect to said additional support to detect movement of said additional support;
wherein said additional silicon support is disposed on said substrate at an angle with respect to said silicon support.

16. The sensing apparatus of claim 15, wherein said additional silicon support, said additional cilia-like structure, and said additional strain detector are disposed to have an optimal flow sensitivity at a different angle than an optimal flow sensitivity of said silicon support, said cilia-like structure, and said strain detector.

17. The sensing apparatus of claim 15, wherein said additional silicon support has a longitudinal axis that is generally orthogonal to a longitudinal axis of said silicon support.

* * * * *